(12) United States Patent
Kowalski

(10) Patent No.: US 6,859,504 B1
(45) Date of Patent: Feb. 22, 2005

(54) RAPID SETTLING AUTOMATIC GAIN CONTROL WITH MINIMAL SIGNAL DISTORTION

(75) Inventor: John M. Kowalski, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/536,287

(22) Filed: Mar. 27, 2000

Related U.S. Application Data

(60) Provisional application No. 60/141,420, filed on Jun. 29, 1999.

(51) Int. Cl.$^7$ .............................................. H04L 27/08
(52) U.S. Cl. ...................................................... 375/345
(58) Field of Search ................................. 375/345, 142, 375/316; 327/113; 324/326; 455/277.1

(56) References Cited

U.S. PATENT DOCUMENTS

| | | |
|---|---|---|
| 4,661,902 A | 4/1987 | Hochsprung et al. |
| 5,029,183 A | 7/1991 | Tymes |
| 5,063,547 A | 11/1991 | Custers et al. |
| 5,070,536 A | 12/1991 | Mahaney et al. |
| 5,077,753 A | 12/1991 | Grau, Jr. et al. |
| 5,231,634 A | 7/1993 | Giles et al. |
| 5,313,169 A | 5/1994 | Fouch et al. |
| 5,345,440 A | 9/1994 | Gledhill et al. |
| 5,412,687 A | 5/1995 | Sutton et al. |
| 5,444,697 A | 8/1995 | Leung et al. |
| 5,471,464 A | 11/1995 | Ikeda |
| 5,487,069 A | 1/1996 | O'Sullivan et al. |
| 5,488,632 A | 1/1996 | Mason et al. |
| 5,506,836 A | 4/1996 | Ikeda et al. |
| 5,541,965 A | 7/1996 | Daffara |
| 5,572,528 A | 11/1996 | Shuen |
| 5,602,835 A | 2/1997 | Seki et al. |
| 5,636,247 A | 6/1997 | Kammerman et al. |
| 5,652,772 A | 7/1997 | Isaksson et al. |
| 5,675,572 A | 10/1997 | Hidejima |
| 5,682,376 A | 10/1997 | Hayashino et al. |
| 5,687,165 A | 11/1997 | Daffara et al. |
| 5,694,389 A | 12/1997 | Seki et al. |
| 5,717,689 A | 2/1998 | Ayanoglu |
| 5,726,973 A | 3/1998 | Isaksson |
| 5,732,113 A | 3/1998 | Schmidl et al. |
| 5,757,766 A | 5/1998 | Sugita |
| 5,787,080 A | 7/1998 | Hulyalkar |
| 5,787,123 A | 7/1998 | Okada et al. |
| 5,812,523 A | 9/1998 | Isaksson et al. |
| 6,049,705 A * | 4/2000 | Xue .......................... 455/277.1 |
| 6,081,558 A * | 6/2000 | North ........................... 375/316 |
| 6,130,539 A * | 10/2000 | Polak ........................... 324/326 |

FOREIGN PATENT DOCUMENTS

JP 03003425 A * 1/1991 ............ H04B/1/40

* cited by examiner

Primary Examiner—Stephen Chin
Assistant Examiner—Curtis Odom
(74) Attorney, Agent, or Firm—Chernoff, Vilhauer, McClung & Stenzel, LLP

(57) ABSTRACT

An apparatus and method of automatic gain control (AGC) useful for a detector of a digital radio providing rapid settling and minimal distortion is described. The automatic gain control includes a plurality of modular AGC elements each having a unique bias. The AGC elements may also be switched from an open loop operating mode with a unique initial gain voltage to a closed loop operating mode. A matched filter is applied to the output of each of the AGC elements to filter out all but the signal constituents that match the reference symbol. The output of the matched filters having the greatest signal to noise ratio is the selected as the detector output. The output with the greatest signal to noise ratio corresponds to the output of the AGC element that has settled with the least distortion.

16 Claims, 2 Drawing Sheets

RAPID SETTLING AUTOMATIC GAIN CONTROL WITH MINIMAL SIGNAL DISTORTION

CROSS-REFERENCE TO RELATED APPLICATIONS

This application claims the benefit of U.S. Provisional Application No. 60/141,420, filed Jun. 29, 1999.

BACKGROUND OF THE INVENTION

The present invention relates to an automatic gain control apparatus and method and, more particularly, to a rapid settling automatic gain control that produces minimal signal distortion useful for a detector of a digital radio receiver.

The detector of a digital radio receiver converts the analog radio frequency (R/F) signal received at the antenna to the digital signal in which the message is encoded. Conversion of the signal from analog to digital format is performed by an analog-to-digital (A/D) converter in the detector. While the amplitude of the received R/F signal can vary substantially, the amplitude variation of the signal at the input to the A/D converter must be narrowly controlled because the data detection circuitry requires a relatively constant amplitude input to avoid clipping and loss of data. The input to the A/D convertor is controlled by an automatic gain control (AGC) loop.

The Institute of Electrical and Electronic Engineers (IEEE), DRAFT SUPPLEMENT TO STANDARD FOR INFORMATION TECHNOLOGY—TELECOMMUNI-- CATIONS AND INFORMATION EXCHANGE BETWEEN SYSTEMS—LOCAL AND METROPOLITAN AREA NETWORKS—SPECIFIC REQUIREMENTS— PART 11: WIRELESS LAN MEDIUM ACCESS CONTROL (MAC) AND PHYSICAL LAYER (PHY) SPECIFICATIONS: HIGH SPEED PHYSICAL LAYER IN THE 5 GHz BAND, IEEE P802.11a/D7.0, July 1999, is a draft of a part of a family of standards for wireless Local and Metropolitan Area Networks (hereinafter, LAN). The proposed standard specifies certain characteristics of a high speed, digital, wireless communication LAN based on Orthogonal Frequency Division Multiplexing (OFDM) and packet switching. The wireless IEEE 802.11a LAN will have a data payload capacity up to 54 Mbit/sec.

In an IEEE 802.11a LAN, data is transferred in data units or frames that include a header and a data section. The header of each data unit includes a preamble field comprising a "short training sequence" and a "long training sequence." The "long training sequence" comprising two 3.2 $\mu$sec. duration symbols is used for channel estimation and fine frequency acquisition by the receiver. The short training sequence comprises ten repetitions of a 0.8 $\mu$sec. duration symbol for a total sequence length of 8 $\mu$sec. The short training sequence is used for automatic gain control (AGC) convergence, antenna diversity selection, timing acquisition, and coarse frequency acquisition by the radio receiver. The AGC circuit must be able to converge or settle within the duration of two—three symbols if there is to be sufficient time in the short training sequence for completion of the remaining operations.

An A/D converter 10 and an associated AGC loop 12 (indicated by a bracket) of a digital radio detector are illustrated in FIG. 1. An analog R/F signal (x(t)) 14 from an antenna and RF amplifier (not illustrated) is converted to a digital signal (y(t)) 16 by the A/D converter 10. In a detector, an output signal level detector (not illustrated) senses whether the signal to noise ratio of the digital signal 16 has reached a predetermined threshold value. The automatic gain control (AGC) loop 12 controls the input 18 to the A/D converter 10 to prevent overshooting or undershooting the converter 10 as the power of the input R/F signal 14 fluctuates over the dynamic range of the system. The power of the signal at the output (y(t))16 of the A/D converter 10 is sensed at a sensor 20. The output signal power is squared in a squaring unit 22. A negative threshold value or bias ($b_k$) 24 is added to the squared output signal power in a summer 26 to produce an error signal (e) 28. The error signal 28 is input to an integrator 30 that produces a gain voltage (v) 32 at the output. The gain voltage 32 is input to an attenuator 34 that produces a gain control characteristic or loop gain (g) 36. The amplitude of the A/D converter input (g(v)x(t)) 18 is controlled by multiplying 38 the received R/F signal (x(t)) 14 by the gain characteristic (g) 36. AGC loops are limited in the range of input signals over which a constant output amplitude can be maintained. For a given input signal dynamic range, the behavior of an AGC loop is a compromise between the time required for the loop to settle and the distortion of the signal by the loop. A high loop gain reduces the settling time. However, a high loop gain distorts the signal leading to a loss of signal to noise ratio for the detector. Obtaining the rapid settling time required by an IEEE 802.11a LAN with an acceptable signal distortion has not proven to be feasible with the classic AGC loop illustrated in FIG. 1.

FIG. 2 illustrates an A/D converter 40 and an associated improved AGC loop 42 (indicated by a bracket) providing improved transient response when compared to the classic AGC illustrated in FIG. 1. The improved AGC 42 includes a mode switch 44 that is used to switch between a closed loop operating mode and an open loop operating mode. In the closed loop mode, a control 46 sets the switch 44 to the closed loop position 48 illustrated in FIG. 2 and the circuit operates essentially as described above. However, when the R/F signal (x(t)) 50 is initially applied to the AGC it is likely to include transient signal components. During initial operation, the control 46 causes the mode switch 44 to select to the open loop mode position 52 and a predetermined initial value of the gain voltage ($\zeta(t)$) 54 is input ($\gamma$) 56 to the attenuator 58. In the open loop mode, the input 60 to the A/D convertor 40 is not dependent upon the power of the output signal 62 which may be influenced by the transient signal components. When the control 46 senses that the gain control voltage (v) 64 at the output of the integrator 66 has approached the open loop control voltage ($\zeta$) 54 the control 46 selects the closed loop position 48 of the mode switch 44 and the AGC switches to closed loop operation. The transient response of the classic closed loop AGC is improved by making the response independent of the power of the output signal while the output is affected by transient signal components and by providing a definite, predetermined form for the output. Further improvement in AGC performance may be obtained by storing an integrator value used for processing a prior reception of the signal in a memory 68 and using that value for a later reception. While the improved AGC provides better transient response, neither the classic AGC nor the improved AGC loop provides the rapid settling required to settle the AGC within the duration of the initial symbols of the preamble of the OFDM signal of the IEEE 802.11a LAN with an acceptable level of signal distortion.

What is desired, therefore, is an automatic gain control capable of rapid settling with minimal signal distortion.

SUMMARY OF THE INVENTION

The present invention overcomes the aforementioned drawbacks of the prior art by providing an automatic gain control comprising a plurality of automatic gain control elements and a discriminator to select the output of an automatic gain control element having a relatively greater signal to noise ratio. The automatic gain control (AGC) elements may comprise a classic AGC loop or an improved AGC loop with facilities to switch between open loop operation and closed loop operation for better transient response. The AGC elements may also include a memory for storing an integrator value used in an earlier processing of the input signal. Each of the AGC elements is operated with a different threshold value or bias. As a result, the effective dynamic range will vary for each of the elements and the elements will converge or settle at different times and with differing degrees of signal distortion. The output of each of the automatic gain control elements is filtered by a matched filter that suppresses all constituents of the signal except constituents in the spectrum of a reference signal; the short training sequence symbol of the IEEE 802.11a data packet. The output of the AGC element that has settled with the least distortion at the time of selection will most closely replicate the reference signal and, therefore, have the greatest signal to noise ratio of all the outputs. A selector is used to choose the output of the matched filter exhibiting the maximum signal to noise ratio.

A detector for a digital radio is also described comprising a first analog to digital signal convertor having an input controlled by a first automatic gain control loop; a second analog to digital signal convertor having an input controlled by a second automatic gain control loop; and a discriminator to select an output of either the first or the second analog to digital signal converter having a relatively greater signal to noise ratio. The A/D convertor with an output that bests replicates the reference signal has settled with the least distortion.

A method of automatic gain control is also described comprising selecting an output of one of a plurality of automatic gain control elements having a greater signal noise to ratio.

A method of detecting a signal in a digital radio receiver is also described comprising the steps of converting an analog signal to a first digital signal with a first analog to digital convertor having an input controlled by a first automatic gain control loop; filtering the first digital signal to suppress all constituents of the signal except constituents matching a reference signal; converting the analog signal to second digital signal with a second analog to digital convertor having an input controlled by a second automatic gain control loop; filtering the second digital signal to suppress all constituents of the signal except constituents matching the reference signal; and selecting one of said first and said second filtered digital signals having a greater signal to noise ratio.

Utilizing the methods and apparatuses described, it is possible to obtain rapid settling of one of the AGC elements without the necessity of high loop gain which would cause signal distortion.

The foregoing and other objectives, features and advantages of the invention will be more readily understood upon consideration of the following detailed description of the invention, taken in conjunction with the accompanying drawings.

DETAILED DESCRIPTION OF THE PREFERRED EMBODIMENT

Figure 1:
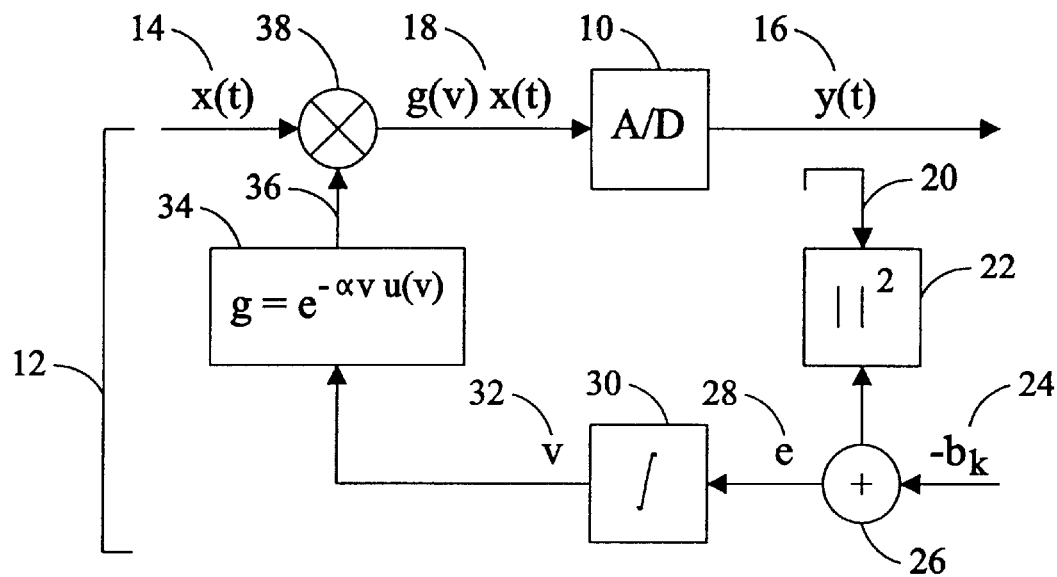
FIG. 1 is a schematic diagram of an analog to digital convertor having an input controlled by an automatic gain control loop.

The analog radio frequency (R/F) signal received at the antenna of a digital radio receiver is converted to the digital signal in which the message is encoded by a detector. The signal conversion is performed by an analog-to-digital (A/D) convertor of the detector. An A/D converter 10 and an associated automatic gain control loop (AGC) 12 (indicated by a bracket) of a digital radio detector is illustrated in FIG. 1. The A/D convertor 10 converts an analog R/F signal (x(t)) 14 received from an antenna and R/F amplifier (not illustrated) into a digital signal (y(t)) 16. In a detector, an output level detector (not illustrated) senses whether the signal to noise ratio of the digital signal has reached a predetermined threshold value. The automatic gain control (AGC) loop 12 controls input to the A/D converter 18 to prevent overshooting or undershooting the converter as the power of the input R/F signal 14 fluctuates over the dynamic range of the system. In an IEEE 802.11a LAN the dynamic range of the system can be in the range of 60 dB. The AGC loop senses the power of the signal at the output (y(t)) 16 of the A/D converter 10. The power of the output signal 16 is squared in a squaring unit 22. A predetermined negative threshold value or bias ($b_k$) 24 is added to the squared output signal power in a summer 26 to produce an error signal (e) 28. The error signal 28 is input to an integrator 30 that produces a gain voltage (v) 32 at the output. The gain voltage 32 is input to an attenuator 34 to produce a gain control characteristic or loop gain (g) 36. The amplitude of the signal at the A/D converter input (g(v)x(t)) 18 is controlled by multiplying 38 the received R/F signal (x(t)) 14 by the gain characteristic (g) 36. The behavior of the AGC loop is a compromise between the time required for the loop to converge or settle and the distortion of the signal by the loop. A high loop gain reduces the settling time of the AGC circuit but distorts the signal leading to a loss of signal to noise ratio for the detector.

Figure 2:
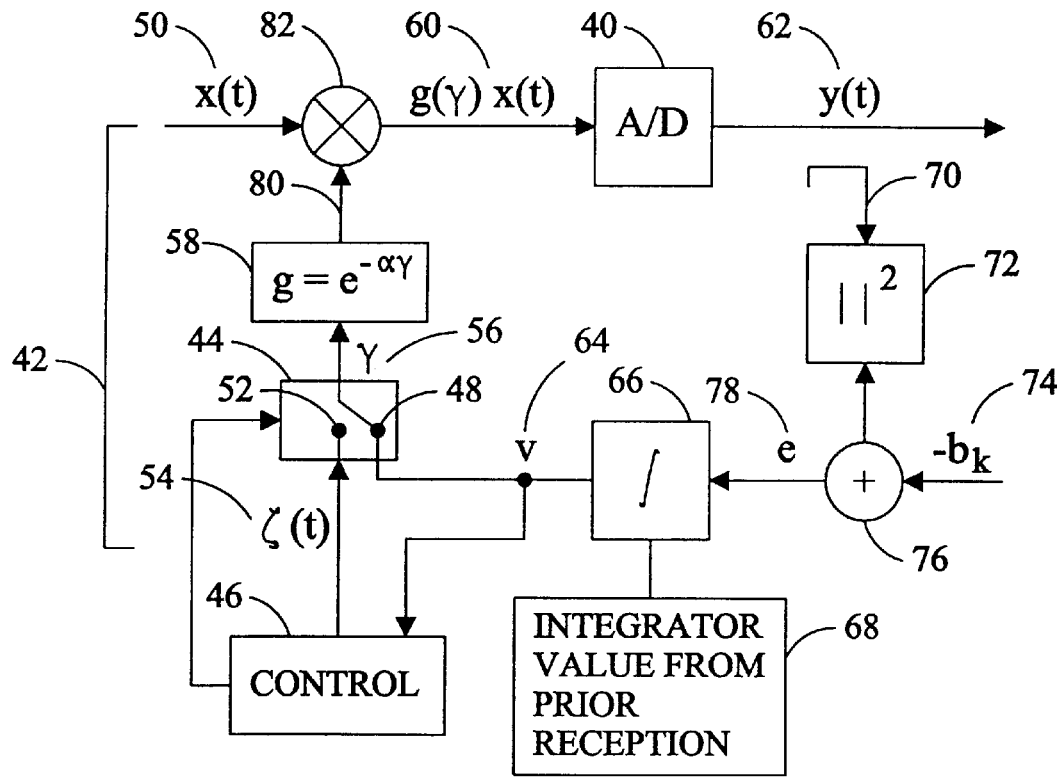
FIG. 2 is a schematic diagram of an analog to digital convertor having an input controlled by an improved, dual operating mode, automatic gain control loop.

FIG. 2 illustrates an A/D converter 40 and an improved AGC loop 42 (indicated by a bracket) providing improved transient response when compared to the classic AGC 12 illustrated in FIG. 1. The improved AGC 42 includes a mode switch 44 that is used to switch between a closed loop operating mode and an open loop operating mode. In the closed loop mode, a control 46 sets the mode switch 44 to the closed loop position 48 as illustrated in FIG. 2. In the closed loop mode, the AGC 42 senses the power of the output signal (y(t)) 62 with a sensor 70. The power of the output signal 62 is squared in a squaring unit 72. A threshold value or bias ($b_k$) 74 is added to the square of the output signal power in a summer 76. The result of the summing operation is an error signal (e) 78 that is input to an integrator 66. The integrator value may be a fixed value or it may be a value that the system utilized when processing a prior reception of the signal and which is stored in a memory 68 for use during a subsequent reception. The control voltage (v) 64 is input to an attenuator 58 through the closed loop mode position 48 of the mode switch 44. The output (g) 80 of the attenuator 58 is multiplied 82 by the received R/F signal (x(t)) 50 to produce the input (g(v) x(t)) 60 to the A/D converter 40. The closed loop operation of the improved AGC 42 is essentially the same as that of the classic AGC 12 illustrated in FIG. 1.

Referring again to FIG. 2, when the R/F signal (x(t)) 50 is initially applied to the AGC 42 the signal is likely to include transient signal components. Since the output signal 62 includes the power of these transient signal components, the closed loop mode response of the AGC would be influenced by the transient signals. Therefore, when the signal is initially received at the detector, the mode switch 44 is switched the open loop mode position 52 and a predetermined initial value of the gain voltage (ζ(t)) 54 is input (γ) 56 to the attenuator 58. In the open loop mode the input 60 to the A/D convertor 40 is not dependent upon the power of the output signal 62 which may be influenced by transient signal components. When the control 46 senses that the gain control voltage (v) 64 at the output of the integrator 66 has approached the open loop control voltage (ζ) 54 the control 46 switches the mode switch 44 to select closed loop operation.

AGC circuits are limited in the dynamic range of input signals over which a constant output level can be maintained. Further, the AGC circuit must have a high loop gain to settle quickly, but a high loop gain causes the AGC loop to distort the signal. In designing an AGC circuit for a system with a given dynamic range, a compromise must be made between the settling or convergence time and signal distortion of the AGC loop. Obtaining the rapid settling and minimal signal distortion required by an IEEE 802.11a LAN has proven to be problematic with either the classic AGC 12 or the improved AGC 42. The present inventor realized that rapid settling time and minimal signal distortion can be accomplished in an AGC circuit by effectively reducing the dynamic range of the input signal to the loop. The inventor also realized that the dynamic range can be effectively reduced if the threshold value or bias applied to AGC loop is approximately equal to the square of the power of the output signal. In other words, faster settling can be accomplished with less loop gain and less signal distortion if the error signal (e) is approximately zero. The inventor concluded that rapid settling and minimal signal distortion can be achieved by selecting the one of the outputs of a plurality of AGC loops operating with different bias values that exhibits the greatest signal to noise ratio.

Figure 3:
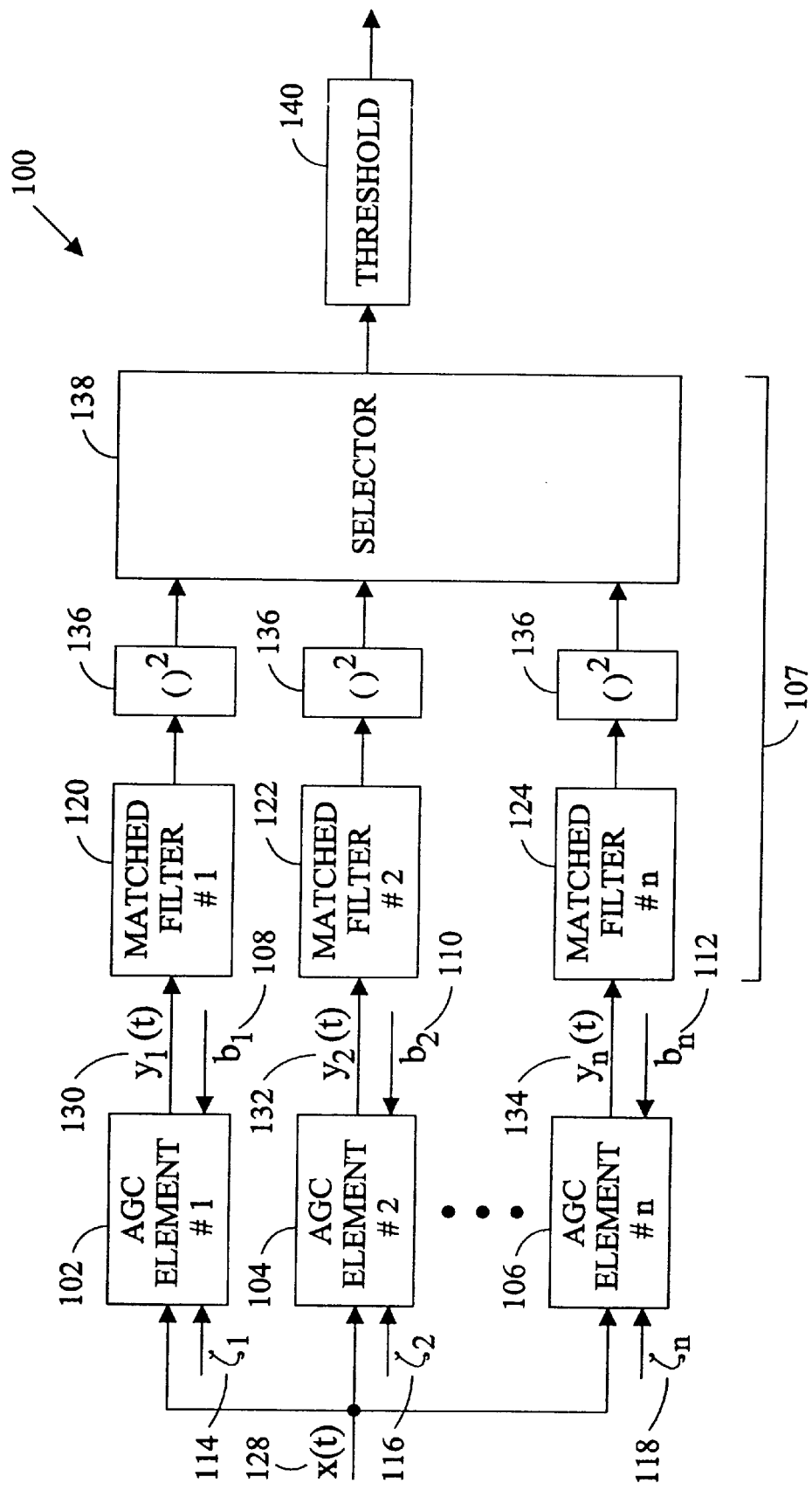
FIG. 3 is a schematic diagram of an exemplary embodiment of the detector of the present invention useful for a digital radio.

Referring to FIG. 3, a detector 100 for a digital radio system according to an exemplary embodiment of the present invention includes a plurality of modular AGC elements 102, 104, and 106 and a discriminator 107 (indicated by a bracket) to distinguish an AGC element from the other AGC elements of the plurality on the basis of the signal to noise ratio of their outputs. Each AGC element 102, 104, and 106 comprises an A/D convertor and an associated AGC loop. The AGC loop may be either a classic AGC loop 12 as illustrated in FIG. 1 or the improved AGC loop 42 illustrated in FIG. 2. It is to be understood that any AGC circuit may likewise be used, as desired. The number and type of AGC elements in a detector are determined by the dynamic range of the system and the desired transient response. A different threshold value or bias ($b_1$) 108, ($b_2$) 110, ... ($b_n$) 112 is applied to the AGC loop in each of the elements 102, 104, and 106. If the AGC element incorporates an AGC loop of the improved type 42 as illustrated in FIG. 2, a different initial value ($ζ_1$) 114, ($ζ_2$) 116, ... ($ζ_n$) 118 may also be used for each of the AGC elements. An integrator value from a prior signal reception could be stored in a memory for each of the AGC elements 102, 104, and 106 utilizing an improved AGC loop 42.

Each of the outputs of the AGC elements 102, 104, and 106 is directed to a matched filter 120, 122, and 124. The matched filters 120, 122, and 124 have a frequency response matching the frequency spectrum of the short training sequence symbols of the preamble of an IEEE 802.11a data packet. The analog R/F frequency input signal (x(t))128 is applied to all of the AGC elements 102, 104, and 106 and converted to a digital signal(y(t) by the A/D converter of the AGC element. Each of the AGC element output signals ($y_1(t)$) 130, ($y_2(t)$) 132, and ($y_n(t)$) 134 is input to one of the matched filters 120, 122, or 124. Since the frequency response of the matched filter matches the frequency spectrum of the reference signal, the matched filter passes the maximum signal power while suppressing as much noise as possible, maximizing the signal to noise ratio at the output of the filters 120, 122, or 124. In other words, the signal to noise ratio at the output of the matched filter 120, 122, or 124 will be greatest for the AGC element 102, 104, or 106 which has converged with the least distortion when the signal to noise ratio is compared. The outputs of the matched filters 120, 122, and 124 are preferably squared in squaring units 136 and the outputs of the squaring units 136 are input to a selector 138. The selector 138 of the discriminator 107 selects the output of the squaring unit 136 having the greatest relative signal to noise ratio of all the filtered outputs. An output signal detector 140 senses whether the signal selected by the discriminator 107 has a signal to noise ratio equal to or greater than a predetermined threshold value. Using this method and apparatus of automatic gain control, it is possible to obtain rapid settling of one of the AGC elements without the necessity of high loop gain for that element which would cause signal distortion.

All references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

What is claimed is:

1. An automatic gain control comprising:
   (a) a plurality of automatic gain control elements, each said automatic gain control element producing an output in response to an input and a bias, an input being substantially the same for each of said plurality automatic gain control elements;
   (b) a discriminator to select an output of an automatic gain control element having a relatively greater signal to noise ratio as an output for said automatic gain control; and
   (c) at least one of the following:
      (i) wherein a value of said bias applied to one of said automatic gain control elements does not equal a value of said bias applied to another of said automatic gain control elements;
      (iii) wherein said discriminator comprises a filter having a frequency response substantially matching a frequency spectrum of a reference signal and arranged to filter the plurality of outputs of said automatic gain control elements, and a selector to select an output of said filter having a relatively greater signal to noise ratio:
      (iv) wherein an automatic gain control element includes a mode switch connecting said automatic gain control element to operate in one of a closed loop operating mode and an open loop operating mode, and a mode control responsive to the output of said automatic gain control element to cause said mode switch to select one of said closed loop and said open loop operating modes;
      (v) wherein an automatic gain control element includes a mode switch connecting said automatic gain control element to operate in an open loop mode with an unique initial gain voltage, and a mode control responsive to the output of said automatic gain control element to cause said mode switch to select a closed loop operating mode;

(vi) wherein an automatic gain control element comprises a memory to store an integration value used in processing a signal.

2. An automatic gain control comprising:

(a) a first automatic gain control element producing an output in response to an input and one of a first bias value and a first initial gain voltage;

(b) a second automatic gain control element producing an output in response to an input and one of a second bias value and a second predetermined initial gain voltage; and (c) a discriminator to select an output of one of said first and said second automatic gain control elements having a relatively greater signal to noise ratio.

3. The apparatus of claim 2 wherein said first and said second predetermined initial gain voltages are equal.

4. The apparatus of claim 2 herein said first and said second automatic gain control elements further comprise:

(a) an operating mode switch to select one of an open loop operating mode and a closed loop operating mode; and (b) a mode control to select said closed loop operating mode when a gain voltage is approximately equal to first or second initial gain voltage.

5. The apparatus of claim 2 wherein said discriminator comprises:

(a) a first filter having a frequency response substantially matching a frequency spectrum of a reference signal and arranged to filter the output of said first automatic gain control element;

(b) a second filter having a frequency response substantially matching a frequency spectrum of said reference signal and arranged to filter the output of said second automatic gain control element; and (c) a selector to select an output of one of said first and said second filters having a relatively greater signal to noise ratio.

6. A detector for a digital radio comprising:

(a) a first analog to digital signal convertor having an input controlled by a first automatic gain control loop;

(b) a second analog to digital signal convertor having an input controlled by a second automatic gain control loop; and (c) a discriminator to select an output of one of said first and said second analog to digital signal converters having a relatively greater signal to noise ratio.

7. The apparatus of claim 6 further comprising an output signal level detector for comparing said signal to noise ratio of the selected output to a threshold signal to noise ratio.

8. The apparatus of claim 6 wherein said discriminator comprises:

(a) a first filter having a frequency response substantially matching a frequency spectrum of a reference signal and arranged to filter said output of said first analog to digital convertor;

(b) a second filter having a frequency response substantially matching a frequency spectrum of said reference signal and arranged to filter said output of said second analog to digital convertor; and (c) a selector to select an output of one of said first and said second filters having a relatively greater signal to noise ratio.

9. The apparatus of claim 6 wherein a bias applied to said first automatic gain control loop is not equal to a bias applied to said second automatic gain control loop.

10. The apparatus of claim 6 wherein one of said first and said second automatic gain control loops further includes:

(a) an operating mode switch to select one of an open loop operating mode and a closed loop operating mode; and (b) a mode control to select said closed loop operating mode when a gain voltage approximately equals a predetermined initial gain voltage.

11. The apparatus of claim 10 wherein said predetermined initial gain voltage for said first automatic gain control loop is not equal to said predetermined initial gain voltage for said second automatic gain control loop.

12. A method of automatic gain control comprising the step of selecting as an output of an automatic gain control an output of one of a plurality of automatic gain control elements having a greater signal noise to ratio, each said automatic gain control element producing an output in response to an input and a bias, a input being substantially the same for each of said plurality of automatic gain control elements; and at least one of the following:

(a) wherein said step of selecting an output having a greater signal to noise ratio comprises the steps of filtering the plurality of outputs of said automatic gain control elements to suppress frequencies of the output except frequencies matching a frequency spectrum of a reference signal, and selecting a filtered output having a greater relative signal to noise ratio;

(b) wherein a bias value applied to at least one of the automatic gain control elements is unique:

(c) further comprising the further steps of operating an automatic gain control element of the plurality in an open loop operating mode, and switching operation of said automatic gain control element to a closed loop operating mode in response to the output:

(d) further comprising the step of determining whether said signal to noise ratio of the selected output exceeds a threshold value;

(e) further comprising the steps of, converting an analog signal to a first digital signal with a first analog to digital convertor having an input controlled by a first automatic gain control loop, filtering said first digital signal to suppress constituents of the first digital signal except said constituents matching a reference signal, converting said analog signal to a second digital signal with a second analog to digital convertor having an input controlled by a second automatic gain control loop, filtering said second digital signal to suppress constituents of the second digital signal except said constituents matching said reference signal, selecting one of said first and said second filtered signals having a greater signal to noise ratio;

(f) wherein a bias applied to said first automatic gain control loop is not equal to a bias applied to said second automatic gain control loop.

13. A method of detecting a signal with digital radio comprising the steps of:

(a) converting an analog signal to a first digital signal with a first analog to digital convertor having an input controlled by a first automatic gain control loop;

(b) filtering said first digital signal to suppress constituents of the first digital signal except said constituents matching a reference signal;

(c) converting said analog signal to a second digital signal with a second analog to digital convertor having an input controlled by a second automatic gain control loop;

(d) filtering said second digital signal to suppress constituents of the second digital signal except said constituents matching said reference signal; and (e) selecting one of said first and said second filtered signals having a greater signal to noise ratio.

14. The method of claim 13 wherein a bias applied to said first automatic gain control loop is not equal to a bias applied to said second automatic gain control loop.

15. The method of claim 13 comprising the further steps of:

(a) operating an automatic gain control element of the plurality in an open loop operating mode; and (b) switching operation of said automatic gain control element to a closed loop operating mode in response to said output.

16. The method of claim 13 further comprising the step of comparing the signal to noise ratio of said selected filtered signal to a threshold signal to noise ratio.

* * * * *